United States Patent [19]

Tan et al.

[11] Patent Number: 4,975,700
[45] Date of Patent: Dec. 4, 1990

[54] ANALOG-TO-DIGITAL CONVERTER WITH NON-LINEAR ERROR CORRECTION

[75] Inventors: Khen-Sang Tan, Plano; Richard K. Hester, Whitewright; John W. Fattaruso, Dallas, all of Tex.

[73] Assignee: Texas Instruments, Incorporated, Dallas, Tex.

[21] Appl. No.: 497,809

[22] Filed: Mar. 21, 1990

Related U.S. Application Data

[63] Continuation of Ser. No. 356,475, May 24, 1989, abandoned.

[51] Int. Cl.[5] .............................................. H03M 1/06
[52] U.S. Cl. .................................... 341/118; 341/155; 341/172
[58] Field of Search ................ 341/118, 120, 161, 162, 341/163, 167, 168, 172, 155

[56] References Cited

U.S. PATENT DOCUMENTS

| | | | |
|---|---|---|---|
| 4,654,815 | 3/1987 | Marin et al. | 341/118 |
| 4,743,885 | 5/1988 | Kobayashi et al. | 341/118 |
| 4,746,902 | 5/1988 | Tol et al. | 341/118 |
| 4,799,042 | 1/1989 | Confalonieri et al. | 341/118 |
| 4,803,462 | 2/1989 | Hester et al. | 341/172 |
| 4,843,395 | 6/1989 | Morse | 341/118 |

*Primary Examiner*—William M. Shoop, Jr.
*Assistant Examiner*—H. L. Williams
*Attorney, Agent, or Firm*—James T. Comfort; Melvin Sharp; Stanton C. Braden

[57] ABSTRACT

An analog-to-digital converter and method which provides error correction is disclosed that eliminates the linear and quadratic error terms which arise through capacitor value dependence upon voltage.

7 Claims, 19 Drawing Sheets

Fig. 1a PRIOR ART

SAMPLING PHASE

ANALOG-TO-DIGITAL CONVERTER WITH NON-LINEAR ERROR CORRECTION

This application is a continuation of application Ser. No. 07/356,475, filed on May 24, 1989, now abandoned.

The dependence of capacitance on voltage can be expressed by the Taylor series expansion equation $$C = C_0(1 + C_1 V + C_2 V^2 + \ldots C_n V^n) \quad (1)$$

where C represents total capacitance, $C_0$ is a constant and $C_1$ through $C_n$ are coefficients of powers of V, with V representing the potential difference between capacitor plates. Depending upon the capacitor plate material and the dielectric materials between the capacitor plates as well as the dielectric thickness, the linear coefficient, $C_1$, can vary from tens to hundreds parts per million per volt (ppm/volt). In comparison, the quadratic coefficient, $C_2$, is typically much smaller, rarely exceeding 10 parts per million per volt squared (ppm/volt²).

Capacitor voltage dependence in relation to conversion error within an analog-to-digital (A/D) converter will be discussed with reference to the schematic drawing of an analog-to-digital converter including a single-ended charge redistribution capacitor array illustrated in FIG. 1a. Capacitors in the array are connected at a common top plate to inverter 2, which is connected across a switch 15, that is capable of shorting the input to the output of the inverter. As shown, capacitors within the array have weighted values of capacitance according to powers of 2. Each capacitor is connected to three switches labeled with a subscripted S, 0, and 1, where the subscripted N represents an integer which are operable to connect to a reference voltage $V_{REF}$, an input voltage $V_{IN}$ and ground. In operation, sampling is accomplished by connecting the bottom plate of the capacitors to voltage $V_{IN}$ and by closing the switch across the inverter 2. Thus, charge is distributed across the capacitor plates due in part to the fact that inverter 2 has a current path established to circuit ground. Therefore, the top plate of the capacitors are charged to voltage $V_{RS}$, the trip point of inverter 2. After the sampling operation, the voltage across the capacitors is held in a hold operation by opening the switch across inverter 2 and the switch connecting the bottom plate of the capacitors to $V_{IN}$. The rest of the hold operation comprises connecting the bottom plate of the capacitor to ground. Charges are redistributed in a redistribution operation which follows the hold operation. Successive approximation of the input signal is accomplished by connecting one bottom plate of a single capacitor to $V_{REF}$ while connecting the bottom plates of remaining capacitors to ground. If the output of inverter 2 is a logic 1, then the switch connection to $V_{REF}$ is maintained, otherwise the connection to $V_{REF}$ is opened and the bottom plate of the capacitors is returned to ground. In a similar manner, the remaining capacitors are connected to either of two levels, a reference voltage $V_{REF}$ and ground. Effectively, a digital representation is carried out through summing proportioned factors of $V_{REF}$ until the sum substantially equals $V_{IN}$. The coefficients of the summed proportions are the digital representation of the input voltage. During redistribution, the voltage into inverter 2 is as follows:

$$\frac{V_{IN}}{V_{REF}} \left\{ \left( \frac{C_1}{2} + C_2 V_{RS} \right)(V_{REF} - V_{IN}) - \frac{C_2}{3}(V_{REF}^2 - V_{IN}^2) \right\} \quad (2)$$

Upon completion of the successive approximation steps, the common top plate of the capacitors will return to $V_{RS}$. FIG. 1b is a schematic drawing which represents the A/D converter of FIG. 1a during the sampling operation or sampling phase. Note that capacitor $C^P$ is shown connected to the array and represents parasitic capacitance. FIG. 1c illustrates an equivalent circuit of the schematic drawing of FIG. 1a during the redistribution operation or phase. Capacitor $C^A$ represent the parallel sum of all capacitors in the array with the bottom plate switched to reference voltage $V_{REF}$. Capacitor $C_B$ represent the parallel sum of all capacitors in the array with the bottom plate switched to ground. The ratio of capacitor $C^A$ to the sum of the quantity $C^A$ plus $C^B$ represents the fractional digital output. The perfect A/D converter will have such a ratio equal to $V_{IN}/V_{REF}$. Ideally, the binary weighting between all the array capacitors should be constant, unfortunately, array capacitances vary with voltage across the capacitors. Therefore, when the successive approximation algorithm implemented by the A/D converter trims capacitor $C^A$ to bring the node identified as being at voltage potential $V_t$ back to voltage $V_{RS}$, then if, for example, an array capacitor that is switched to $V_{REF}$ on its bottom plate is less than its ideal binary value, the algorithm will later add more capacitance to produce a $C^A$ in order to achieve a $V_T = V_{RS}$. For example, if the current capacitor test in the successive approximation algorithm switches the bottom plate of a capacitor from ground to $V_{REF}$, and if that capacitor is normally 16 pico farads (pf) but in actuality is only 15.9 pf because of bias voltage dependence, then the net effect on voltage $V_T$ will be less, and additional smaller capacitors will have to be switched up to $V_{REF}$ as well in order to reach the target of making $V_T = V_{RS}$.

Figure 1A:
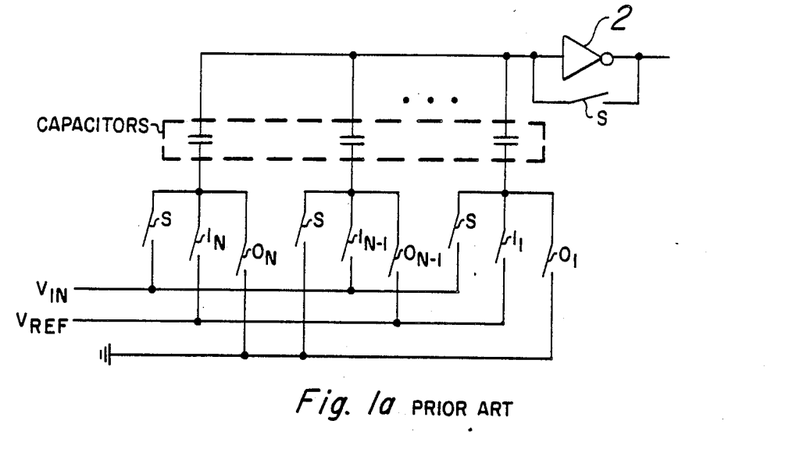
Figure 1B:
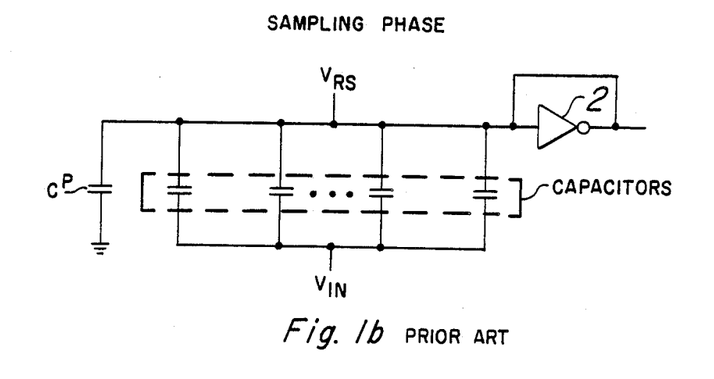
Figure 1C:
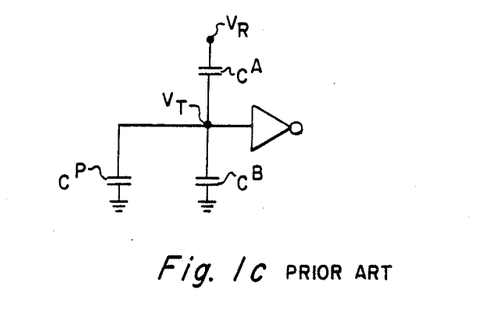

Typically, CMOS ADCs up to 10-bit resolution are implemented in the single-ended topology of FIG. 1a; and voltage coefficients up to 800 ppm/volt can be tolerated. Beyond 10-bit resolution, fully differential topologies are used due to their general characteristics of improved noise immunity as well as an important extra degree of freedom in the sample-and-hold operations.

Figure 2A:
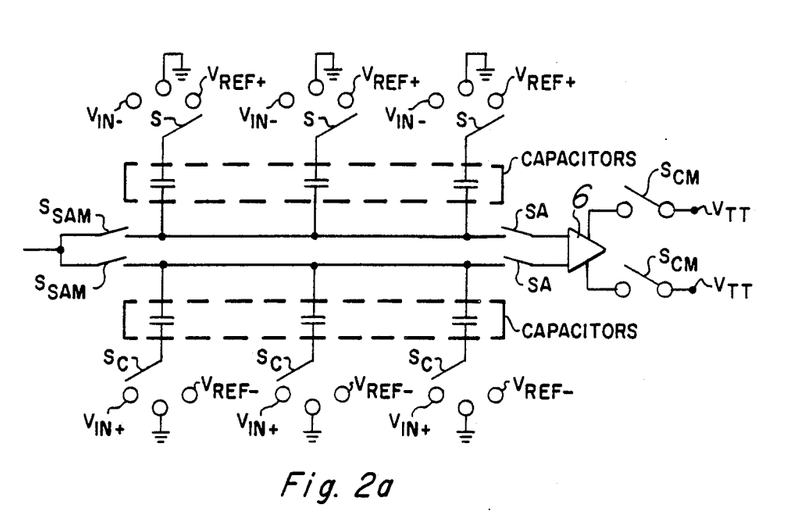
Figure 2B:
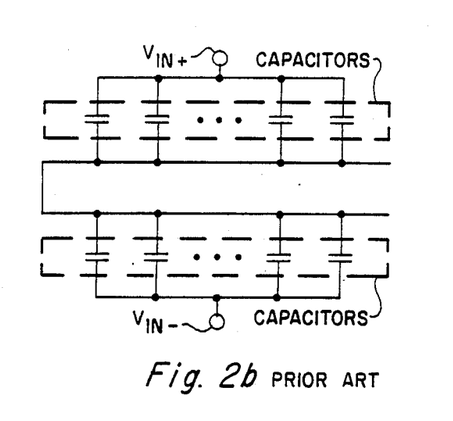
Figure 2C:
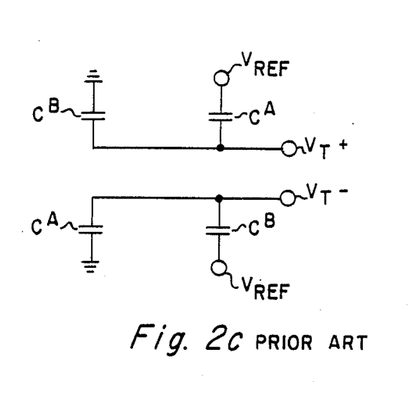

FIG. 2a illustrates a fully differential A/D converter architecture which comprises two identical arrays of capacitors which are connectable through a switch in each array to comparator 6. Voltage $V_{SAM}$ can be connected to each capacitor array through switches $S_{SAM}$. Each capacitor in the arrays is associated with its own switch $S_C$. The switches in the first array of capacitors are operable to connect either to voltages $V_{IN-}$, $V_{REF}$ or ground. The switches in the second array of capacitors are operable to connect either to voltages $V_{IN+}$, $-V_{REF}$, or ground. During a sampling operation, switches $S_{SAM}$, $S_A$ and $S_{CM}$ (switches $S_{CM}$ connect the common mode signal to comparator 6 and switches $S_A$ connect the arrays to the comparator) are closed and the switches of the first array are connected to voltage $V_{IN-}$ while the switches of the second array are connected to voltage $V_{IN+}$. Thus, the top plates (top plates refer to the capacitor plates which directly contact the inputs of the comparator when the comparator switches are closed) of both arrays are charged to $V_{SAM}$ while the bottom plates of the first array are charged $V_{IN-}$ and the bottom plates of the second array are charged $V_{IN+}$. In a hold operation, switches $S_{SAM}$ are opened and switches $S_C$ are connected to ground. After the hold operation switches connecting a common mode input voltage to comparator 6 are closed. Next, a charge redistribution operation is carried out implementing successive approximation of the input signal by connecting the bottom plates of the capacitors either to $V_{REF}$ or ground as in the previously discussed single-ended case. When a particular capacitor in one array is connected to $V_{REF}$, the corresponding capacitor in the other array is connected to ground. Completion of conversion leaves both top plates at the potential of the common mode input voltage. FIG. 2b illustrates an equivalent circuit of the schematic drawing of FIG. 2a during the sampling operation or sampling phase. FIG. 2c is an equivalent circuit of the schematic drawing of FIG. 2a during the redistribution operation or phase. The fractional digital output $$\frac{C_A - C_B}{C_A + C_B}$$

is as follows: with $V_{T+}$ and $V_{T-}$ (($V_{T+}+V_{T-})/2=V_T$) approaching $V_{REF}/2$ after successive approximation $$\frac{C_A - C_B}{C_A + C_B} = \frac{V_{IND}}{V_{REF}} + \frac{V_{IND}}{V_{REF}} + \quad (3)$$

$$\frac{V_{IND}}{V_{REF}} \left( \frac{C_1}{2} (V_{REF} - 2V_T) - \frac{C_2}{12} (V_{REF}^2 - (V_{IND})^2) \right)$$

The error of the fully differential A/D converter architecture can be expressed (assuming for this case a zero voltage common mode input to comparator 6) as $$\frac{V_{IND}}{V_{REF}} \left( \frac{C_1}{2} (V_{REF} - 2V_T) - \frac{C_2}{12} (V_{REF}^2 - (V_{IND})^2) \right) \quad (4)$$

$C_1$ and $C_2$ are coefficients and $V_{IND}$ is the differentially applied input voltage, $V_{IN+}-V_{IN-}$. In A/D converters required to meet today's conversion accuracy demands, it is necessary to efficiently cancel both the first and second order factors of error. Until now, no existing A/D converters have accomplished this.

OBJECTS OF THE INVENTION

It is an object of the invention to provide a new and improved A/D converter.

It is another object of the invention to provide a new and improved A/D converter which corrects errors in measurement.

It is a further object of the invention to provide a new and improved A/D converter, having weighted capacitors, which corrects errors in measurement due to the capacitor value dependence upon voltage.

It is still a further object of the invention to provide a method for A/D error correction.

It is yet another object of the invention to provide a method for A/D error correction due to errors caused by capacitor value dependence upon voltage.

These and other objects of the invention, together with the features and advantages thereof, will become apparent from the following detailed specification when read together with the accompanying drawings, in which applicable reference numerals, reference symbols and reference letters have been carried forward.

SUMMARY OF THE INVENTION

The foregoing objects of the invention are accomplished by an apparatus and method which adds a correction term to an intermediate voltage of an A/D converter which uses capacitors or other devices whose values are capable of variation with voltage, in order to correct A/D conversion errors caused by value variation.

The apparatus comprises a non-linear function generator whose output is proportional to the input voltage of the capacitor multiplied by the quantity of a reference voltage of the converter squared minus the input voltage squared. The non-linear function generator is connected to a correction capacitor array, including adjustable gain, which scales the value of the generator output voltage so as to provide the proper correction factor necessary to be added to the A/D converter.

A method for adjusting/calibrating the gain factor of the capacitor array is provided by the invention, as well as a method for using the apparatus along with the gain factor adjustment/calibration.

BRIEF DESCRIPTION OF THE DRAWINGS

FIGS. 1a through 12 illustrate A/D converters and associated circuitry used in the invention.

DETAILED DESCRIPTION OF THE INVENTION

The error term expressed in equation (4) can be reduced by eliminating the coefficient of the $C_1/2$ term. Elimination of this term occurs by setting voltage $V_T=V_{REF}/2$. Equation (4) reduces to the following:

$$\frac{C_2}{12} (V_{REF}^2 - (V_{IND})^2) \quad (4a)$$

Figure 3:
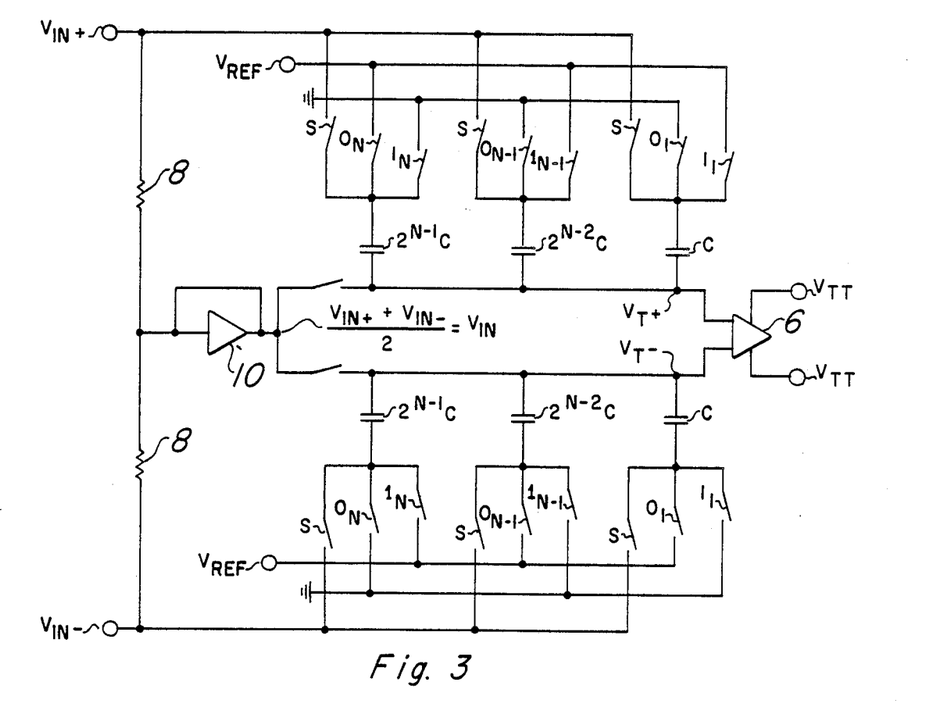

FIG. 3 illustrates a schematic drawing of the circuit accomplishing the elimination of the linear error coefficient contribution as discussed above. This circuit is similar to the circuit of FIG. 2a with the following exceptions. As shown, a resistor divider 8 is used to derive the common mode input signal from differential inputs $V_{IN+}$ and $V_{IN-}$. During sampling, the top plates of both capacitor arrays are charged to this common mode voltage, causing $v_{IND}/2$ ($V_{IND}=V_{IN+}-V_{IN-}$) to appear across the upper array and $-V_{IND}/2$ to appear across the lower array. An optional unity gain buffer can be connected as shown to increase sampling speed. Switches connected to each capacitor in the arrays are labeled S, 1 and 1, with a corresponding subscript for capacitor association indication. Switch S is operable to connect to an input voltage for sampling while switches 0 and 1 connect either to reference voltage, Vref, or ground. Note that 0 and 1 can correspond to a multiplier of each array capacitor value. Successive approximation begins when all switches, $O_K$ (K being an integer) are closed and the most significant bit (sign bit) is determined. Notice that the $0_N$ and $1_N$ (MSB) switches are connected to the $V_{REF}$ and ground buses differently than all other $0_K$ and $1_K$ switches. This allows bipolar input signals and adds $V_{REF}/2$ common-mode signal to the top plates. This common-mode level remains for the duration of the conversion, leaving $V_T = V_{REF}/2$ as desired. The circuit of FIG. 3, in addition to its cancellation of the error associated with the linear voltage coefficient, also offers another important advantage in that the common-mode voltage presented to comparator 6 remains independent of the input common-mode voltage of the converter. This relaxes the common-mode rejection requirement of the comparator.

When the sampling method of elimination of linear voltage error coefficient effects, as discussed above, is used, converter linearity to 15 bits can be achieved. Greater than 15 bit linearity will generally require quadratic voltage coefficient correction. Stated another way, the quadratic term in equation (3) must be canceled. This can be accomplished by subtracting the following component from equation (3):

$$G V_{IND} (V_{REF}^2 - V_{IND}^2) \quad (5)$$
$$G = \text{GAIN FACTOR}$$

Figure 4:
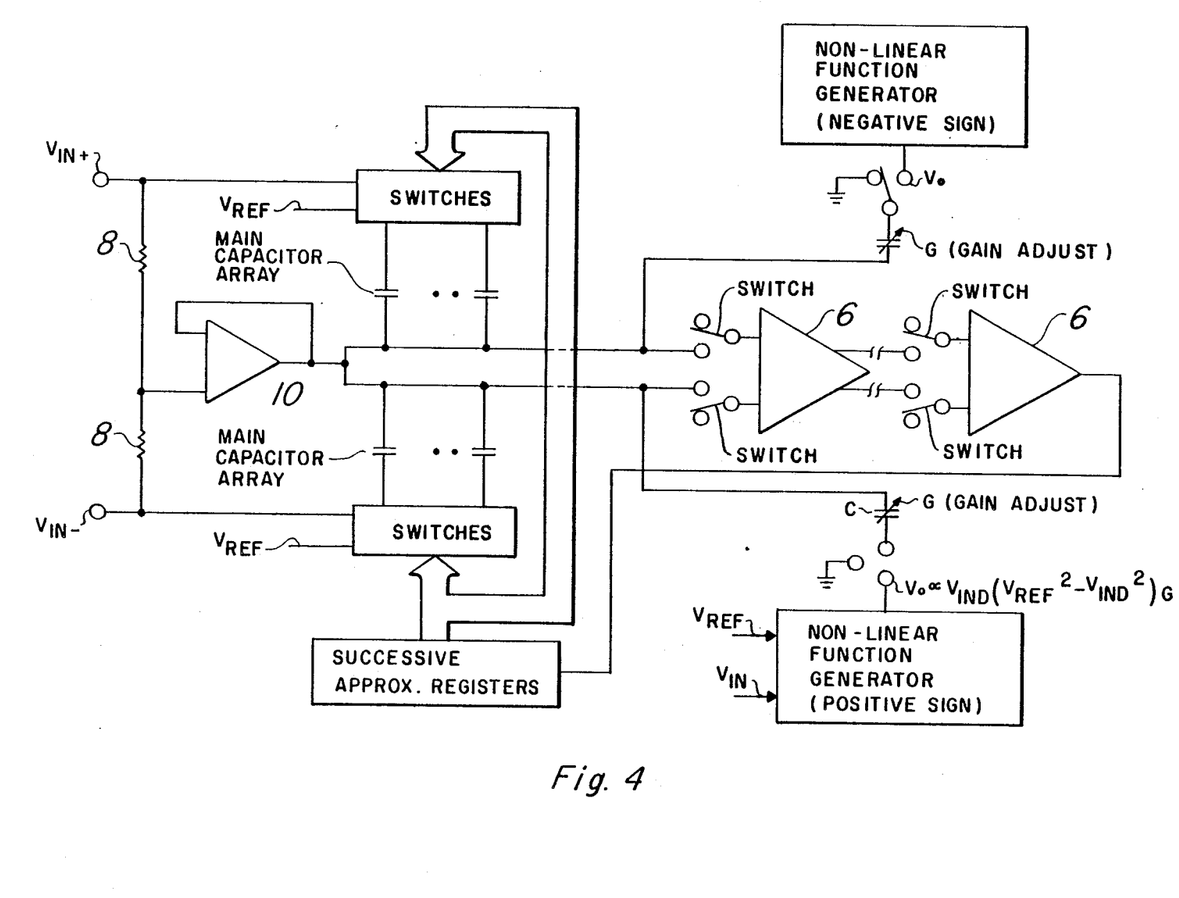

Removal of the quadratic error term involves the addition of a correction term which can be produced in part by a non-linear function generator. The non-linear function generator produces an output signal, Vo, proportional to $V_{IN}(V_{REF}^2 - V_{IN}^2)$. A gain factor produced, for example, by an array of capacitors having an adjustable gain multiplies the non-linear function generator output in order to achieve the necessary correction term. FIG. 4 illustrates a schematic diagram of an A/D converter similar to that shown in FIG. 3 with the addition of two non-linear function generators (a positive sign non-linear function generator for correcting negative error and a negative sign non-linear function generator for correcting positive error), a correction capacitor array CA for each generator, and switches between comparators 6, the generators, correction capacitor arrays and the main arrays of capacitors. The diagram of FIG. 4 also shows registers for use in carrying out successive approximation functions.

Figure 5:
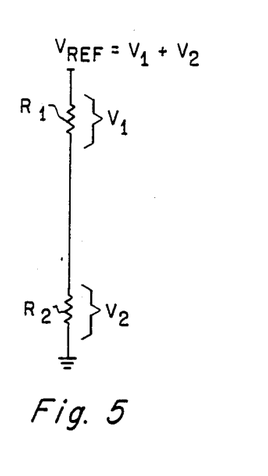
Figure 6:
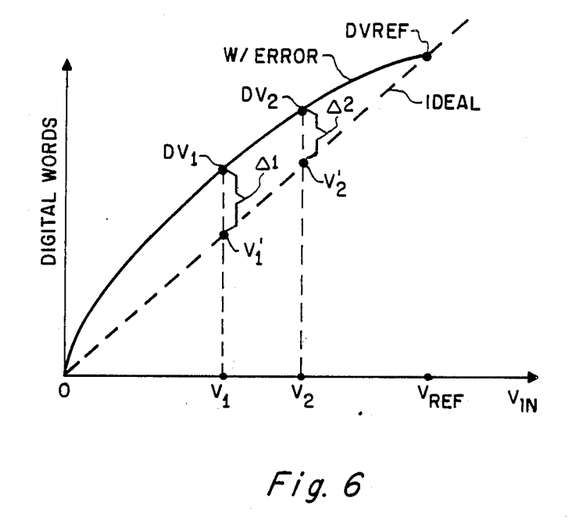

Assuming a predetermined non-linear function generator output, a method follows, for use with an A/D converter (specifically directed to the A/D converter of FIG. 4), which determines (adjusts/calibrates) the necessary gain factor used in error correction. A calibration circuit is used in connection with the gain factor calculation. FIG. 5 illustrates a possible part of this calibration circuit and shows two resistors, $R_1$ and $R_2$ in series connected to and between $V_{REF}$ and ground. Reference voltage $V_{REF}$ is selected as equal to the maximum input voltage $V_{IN}$ for the A/D converter of FIG. 4. An input voltage $V_1$, which is lesser in value than $V_{REF}$, results across resistor $R_1$ and an input voltage $V_2 = V_{REF} - V_1$ results across resistor $R_2$. Voltages $V_1$, $V_2$ and $V_{REF}$ are input separately into the A/D converter and the digital outputs resulting therefrom are noted. With reference to FIG. 6, which illustrates a graph of the A/D transfer curve (digital words vs. voltage), it is seen that the ideal transfer characteristic (straight line) and the transfer characteristic with error (bowed line) are labeled. Note, that depending on the sign of the error that the bow in the characteristic DV1, DV2, and DVREF represent the digital word outputs (note that digital words are simply the digital representation, i.e. 10001001 and etc., of an analog signal) resulting from the inputs of the voltages $V_1$, $V_2$, and $V_{REF}$ respectively, to the converter. $V_1'$ and $V_2'$ are the digital outputs that would be produced if the converter operated ideally. Thus $V_1' + V_2' = V_{REF}$. However, assuming that the A/D converter introduces error, the error characteristic shown in FIG. 5 illustrates that $DV1 = (V_1' + \text{delta } 1)$ and that $DV2 = (V_2' + \text{delta } 2)$, where the deltas represent the deviation from the ideal characteristic. The addition of DV1 and DV2 equals $DV_{REF} + \text{delta } 1 + \text{delta } 2$. Subtracting $DV_{REF}$ from this quantity reveals the error of the converter such that the error = delta 1 + delta 2 = (DV1 + DV2 − DVREF). The sign of the capacitor array gain factor must be chosen. First, the gain of the adjustable capacitor CA is set equal to zero. If DV1 + DV2 − DVREF is greater than zero, then the sign of the needed gain factor is negative. Otherwise the gain factor is positive. If the gain factor is negative, then the negative sign non-linear function generator is required for error correction. On the other hand, if the gain factor is positive, then the positive sign non-linear function generator is required for error correction. After the proper sign of the capacitor array gain factor is chosen, the magnitude of the capacitor array gain factor is adjusted iteratively using binary search or other search techniques. Note that the negative non-linear correction array will output only zero to negative value outputs while the positive non-linear correction array will output only zero to positive value outputs. Assuming that the gain can be digitally represented and adjusted, one such binary search method is as follows:

(1) Set the gain G of the correction capacitor array at one half the maximum gain of the correction capacitor array.

(2) The most significant bit of gain factor G will be determined.

(3) Compute (DV1 + DV2 − DVREF) and subtract the (DV + DV2 − DVREF) quantity used in determining the gain of the correction capacitor array. If the magnitude of the difference is increased, then the present bit of gain factor G is set equal to zero. Otherwise, if the magnitude of the difference is decreased, set the present bit of the gain factor equal to one. (Binary representations are assumed)

(4) Repeat step (3) for each bit of gain factor G.

With this method, the correction capacitor array gain factor is determined. Assuming on-chip correction circuitry, gain factor G must be adjusted/calibrated in the foregoing described manner each time the chip is powered up or every time out of tolerance temperature changes occur. This adjustment/calibration can easily be accomplished by digital control circuitry which may exist on the same chip.

A description of the non-linear function generator follows.

Figure 7:
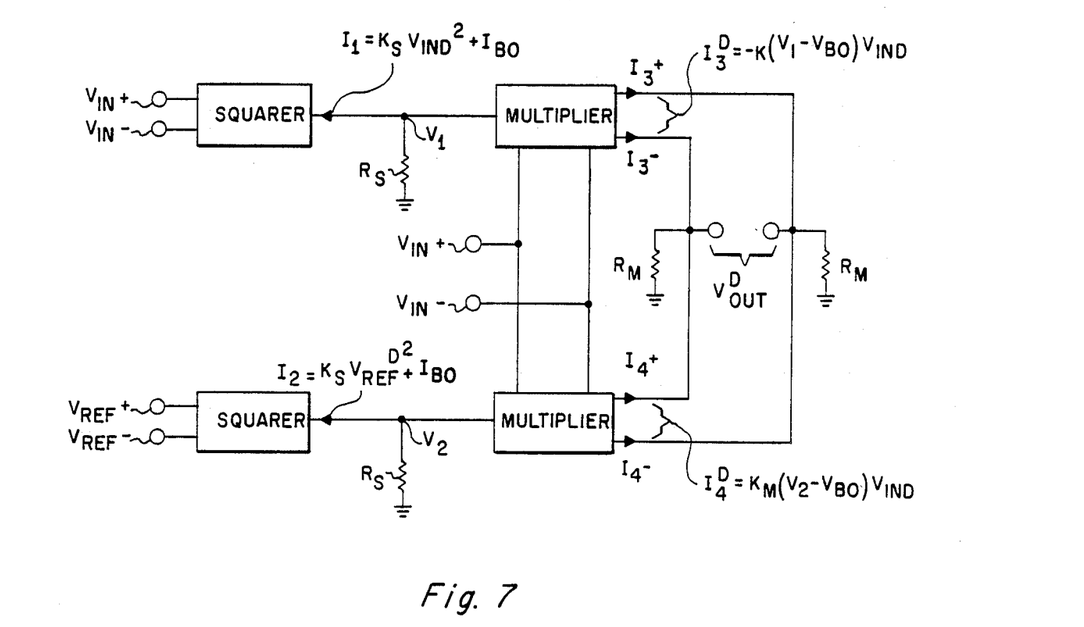

FIG. 7 illustrates a block diagram of the non-linear function generators discussed above and shown in FIG. 4. As shown, two squarer function circuits are connected to two multiplier circuits. A resistor $R_S$ is connected to and between each squarer/multiplier connection and ground. One squarer receives differential inputs $V_{IN+}$ and $V_{IN-}$ from an input sampling network (not shown), while the other squarer receives differential inputs $V_{REF+}$ and $V_{REF-}$ from another input sampling network (not shown). Likewise, the multiplier circuits receive differential inputs $V_{IN+}$ and $V_{IN-}$ from a common input sampling network (not shown). The multipliers are connected together at two common nodes and each multiplier outputs two signals which result in a function generator differential output $V^D_{OUT}$ existing between the common nodes and across two resistors $R_M$ and ground. Voltages V1 and V2 are shown as the voltage at the $R_S$ connection to the respective multipliers and squarers. Currents into the squarers and out of the multipliers are labeled. Plus and minus signs in connection with the letter D following a symbol represent differential signals. The symbol $h_S$ represents the squarer gain constant and the symbol $h_M$ represents the multiplier gain constant. $I_{BO}$ represents bias current. $V_{REF}^D$ represents a differential reference voltage. The differential output of the non-linear function generator is as follows.

$$V_{OUT}^D = h_S R_S H_M R_M V_{IND}[V_{REF}^{D2} - V_{IND}^2] \quad (6)$$

Figures 8A, 8B:
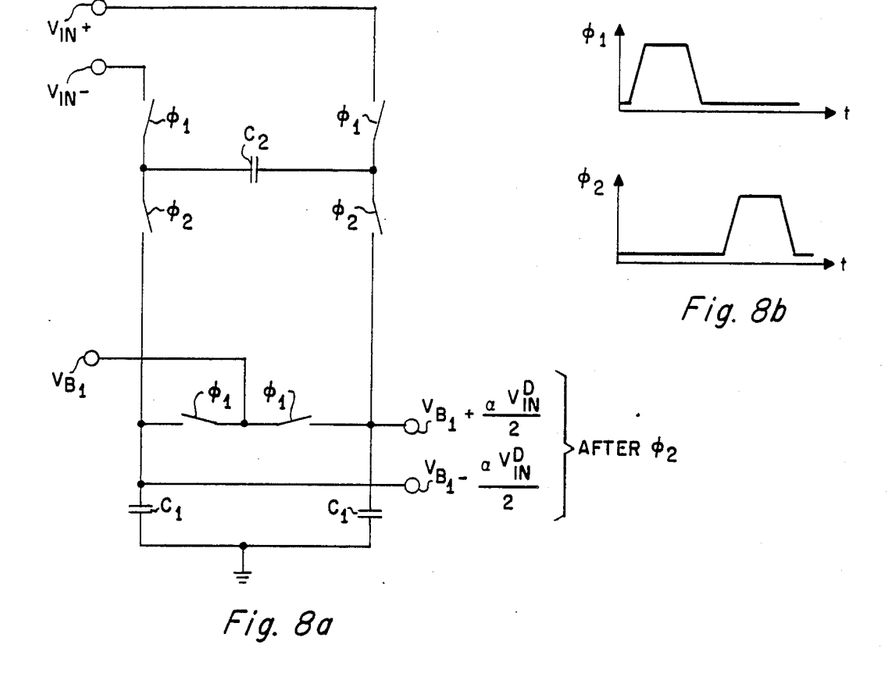

FIG. 8 illustrates a schematic drawing of the input sampling network referenced in the preceding paragraph which receives the inputs of an associated squarer or multiplier. The particular input sampling network is specifically directed to the input sampling network connected to the squarer circuits. As shown, the input sampling network comprises two capacitors $C_1$ and two switches, S1 and S2, which are operable to close their connections in response to clock phases $O_1$ and $O_2$. The input sampling network of FIG. 1 is biased by voltage $V_{B1}$. The sampling network is additionally biased by $$V_{B1} + \alpha \frac{V_{IND}}{2} \quad (7)$$

and $$V_{B1} = \frac{\alpha V_{IND}}{2} \quad (8)$$

(where alpha equals)

$$\alpha = \frac{C_2}{C_2 + \frac{C_1}{2}} \quad (9)$$

after clock phase $O_2$. The characteristic of a clock phase versus time is also illustrated in FIG. 8b.

Figure 9:
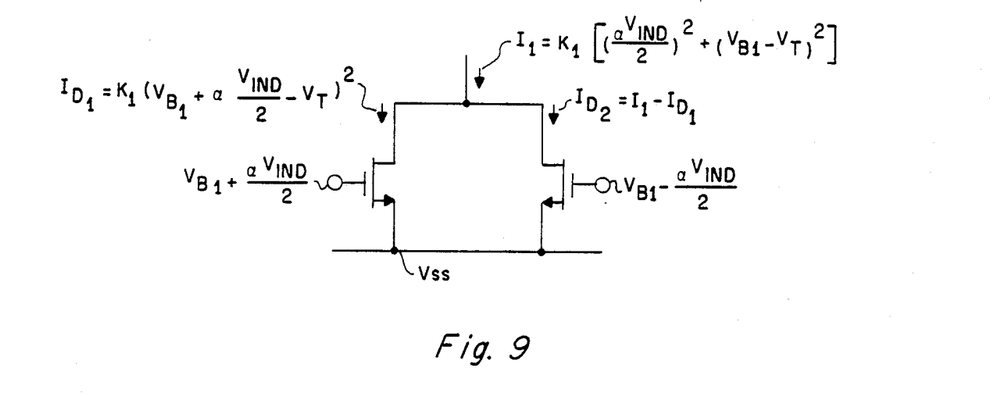

FIG. 9 illustrates a schematic drawing of the squarer circuit. As shown, two N-channel transistors $M_1$ and $M_2$ are connected together at the respective source and drain regions of each as shown. The expressions for the drain currents for each transistor $M_1$ and $M_2$ are noted on FIG. 9. $V_{TH}$ represents transistor threshold voltage. Additionally note, on the Figure, the gate voltage of each transistor. Gain factor $K_1$ can be expressed by the following:

$$k_1 = \frac{\mu C_{ox}}{2} \left( \frac{w}{L} \right) \quad (10)$$

where u is the channel mobility, $C_{ox}$ is the oxide capacitance per unit area, W the channel width, and L is the channel length.

Figure 10:
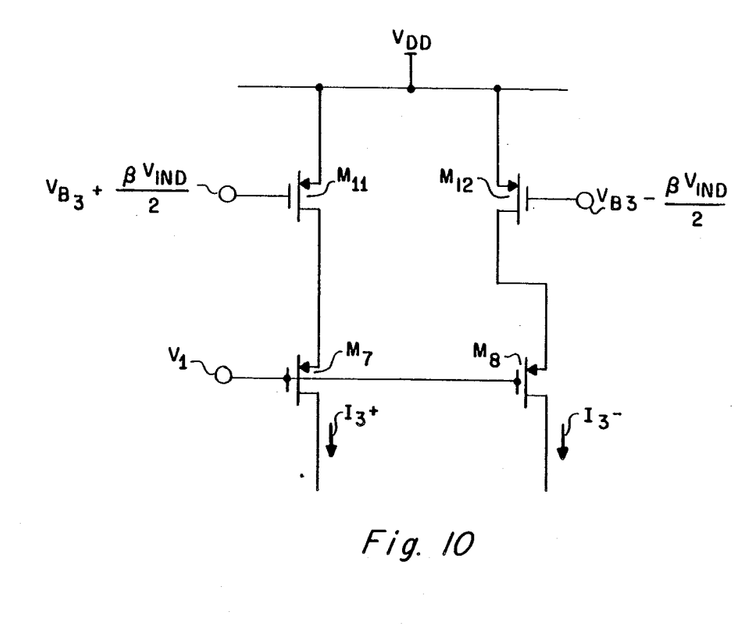

FIG. 10 illustrates a schematic drawing of the multiplier circuit. The multiplier circuit comprises P-channel transistors $M_{11}$, $M_{12}$, $M_8$, and $M_7$ connected as shown with input voltages and currents as shown and discussed previously. Voltage $V_{B3}$ is a bias voltage input to the non-linear function generator and voltage $V_{DD}$ serves as the supply voltage to the multiplier. Beta is the ratio of $C_2$ to the quantity $C_2$ plus $C_1/2$ where the subscripted Cs are from the input sampling network connected to the multiplier.

Figure 11:
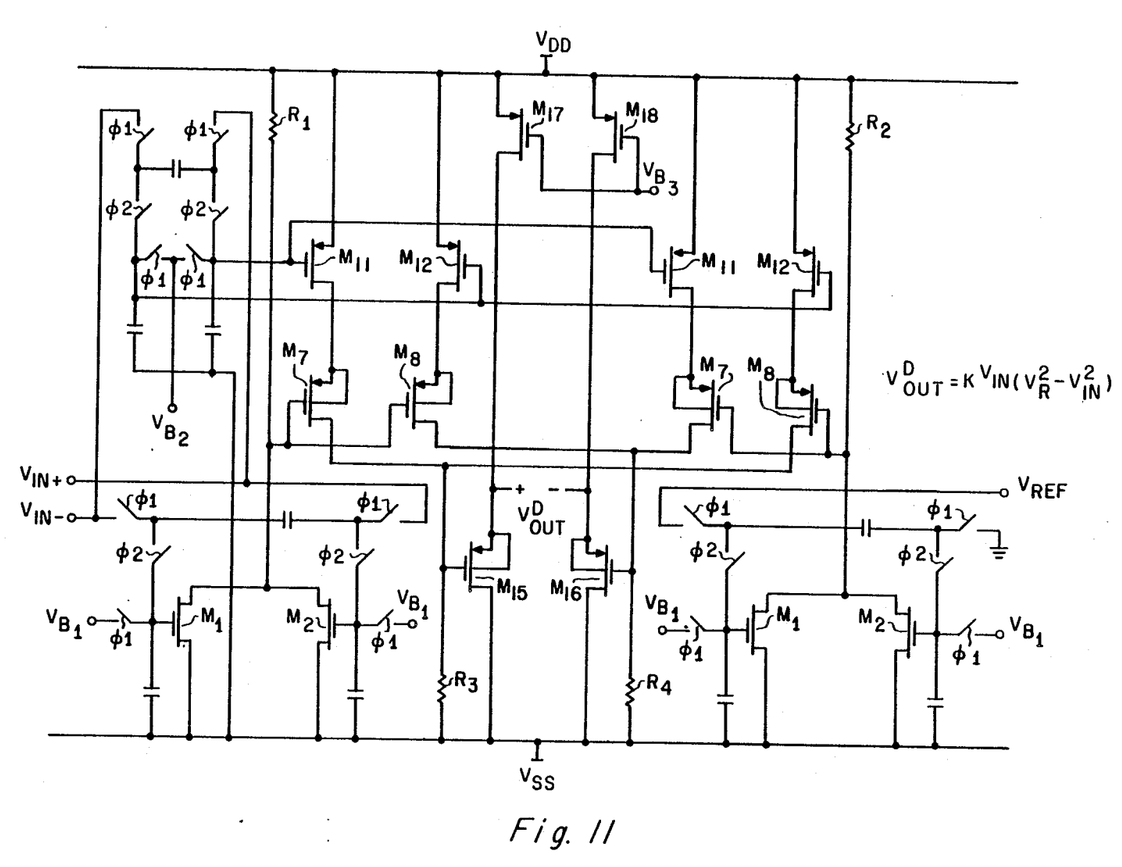

FIG. 11 represents the full blown non-linear function generator connected between voltages $V_{DD}$ and $V_{SS}$. P-channel transistors $M_{15}$ through $M_{18}$ are also illustrated and serve to produce differential output $V^D_{OUT}$. The various transistors to the multipliers are labeled differently in each multiplier for easier identification. Additionally, other transistors and voltages are marked as shown, which contribute to the overall connection of the non-linear function generator, which was not shown in the block diagram of FIG. 7. As noted on FIG. 11, the differential output is as follows:

$$V_{OUT}^D = K_S R_S h_M R_M V_{IND}(V_{REF}^{D2} - V_{IND}^2) \quad (11)$$

where K is equal to $$K = h_S R_S K_M R_M \quad (12)$$

Although the foregoing function generator has been described capable of producing the proper output, note that other function generators having entirely different structures are contemplated as being within the true scope and spirit of the invention when used for the purposes heretofore set forth.

Figure 12:
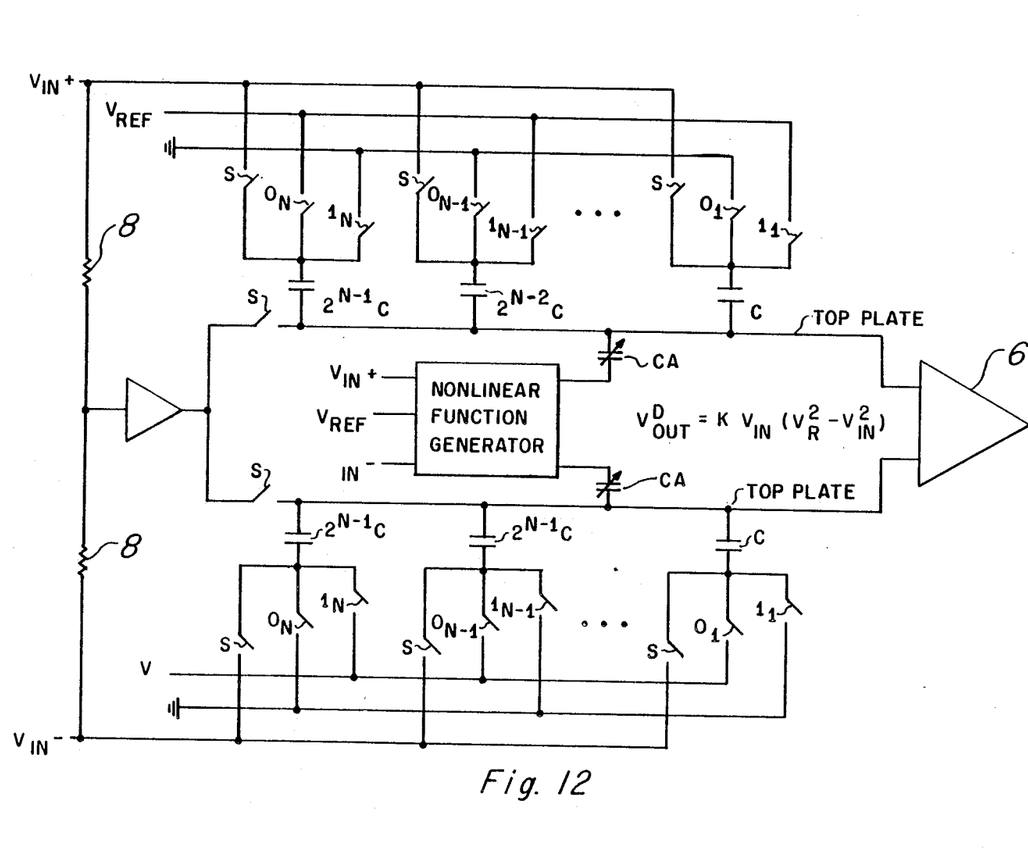

FIG. 12 illustrates a schematic drawing of a differential capacitor array A/D converter using a single non-linear function generator. The generator can be connected to the appropriate capacitor array CA to correct for positive or negative errors. During A/D conversion, in the sampling mode the main array capacitors sample the input signal along with a correction circuit which comprises the correction capacitor arrays and the non-linear function generator. The correction circuit generates a correction proportional to the input voltage multiplied by the quantity of the reference voltage squared minus the input voltage squared. Coupled with the proper value of gain factor through the correction capacitor array, the signal from the correction circuit is introduced into the top plate of the main capacitor array during the hold operation or after sampling in order to eliminate the quadratic term error previously discussed.

Although the invention has been described in detail herein, with reference to its preferred embodiment, it is to be understood that this description is by way of an example only, and is not to be construed in the limiting sense. It is to be further understood that numerous changes in the details of the embodiments of the invention, and additional embodiments of the invention, will be apparent to, and may be made by persons of ordinary skill in the art having reference to this description. Note that N-channel transistors disclosed in the foregoing can be substituted with P-channel transistors and vice versa. Additionally, bipolar transistors can be substituted for the field effect transistors shown. Although metal oxide semiconductor MOS (where oxide in its commonly accepted meaning with reference to the term MOS generally encompasses all insulative material) are implicitly assumed throughout, other types of field effect transistors are contemplated as being within the scope of the invention. Note that A/D converters using successive approximation techniques having resistors instead of capacitors is additionally contemplated as being within the scope of the invention. Moreover, other A/D converter operation which simulates the weighted order of the capacitors can also benefit from the invention. Additionally, other A/D converter architecture can be used in connection with the invention and the foregoing specific examples of A/D converters using the invention were given for example only. It is contemplated that all such changes and additional embodiments are within the true scope and spirit of the invention as claimed below.

We claim:

1. An analog-to-digital converter including:
   a main array of capacitors;
   a non-linear function generator capable of generating a voltage proportional to a quadratic error term associated with conversion error due to capacitor value dependence upon voltage; and
   a correction capacitor array, said correction array including an adjustable gain, said correction capacitor array being operable in combination with said non-linear function generator to add a correction factor, to said main array of capacitors, which is substantially equal in magnitude and opposite in sign to said quadratic error term.

2. An analog-to-digital converter as recited in claim 1 wherein said non-linear function generator is coupled to said main array of capacitors through said correction capacitor array.

3. An analog-to-digital converter as recited in claim 2 wherein said array if a single capacitor.

4. An analog-to-digital converter as recited in claim 2 wherein said correction capacitor array is a binary weighted capacitor array.

5. An analog to digital converter as recited in claim 1 wherein said non-linear function generator comprises:
   a first squarer circuit operable to generate a first current including a component dependent upon the square of differential input voltages;
   a first multiplier circuit, operable to generate a first output current proportional to the product of a differential input voltage, coupled to said first squarer circuit;
   a second multiplier circuit coupled to said first multiplier circuit and being operable to generate a second output current proportional to the product of a differential input voltage; and
   a second squarer circuit, operable to generate a second current including a component dependent upon the square of a differential reference voltage, coupled to said second multiplier circuit.

6. A self-calibration method for an analog-to-digital converter to correct a quadratic error term associated with conversion error due to capacitor value dependence upon voltage which includes:
   determining the sign of a correction term by comparing the sum of digital words after subtracting a reference word value against a threshold value; and
   iteratively adjusting the gain factor of a capacitor array.

7. The method of claim 6 wherein said iterative adjustment is accomplished by a binary method.

* * * * *